(12) United States Patent
Kayanakis

(10) Patent No.: US 6,390,375 B2
(45) Date of Patent: May 21, 2002

(54) CONTACTLESS OR HYBRID CONTACT-CONTACTLESS SMART CARD DESIGNED TO LIMIT THE RISKS OF FRAUD

(75) Inventor: Georges Kayanakis, Antibes (FR)

(73) Assignee: Ask S.A., Sophia Antipolis (FR)

( * ) Notice: Subject to any disclaimer, the term of this patent is extended or adjusted under 35 U.S.C. 154(b) by 0 days.

(21) Appl. No.: 09/725,078

(22) Filed: Nov. 29, 2000

(30) Foreign Application Priority Data

Nov. 29, 1999 (FR) ............................................. 99 15020

(51) Int. Cl.$^7$ ............................................. G06K 19/06
(52) U.S. Cl. ....................... 235/492; 235/486; 235/487; 235/488; 235/380; 361/737
(58) Field of Search ................................. 235/492, 486, 235/487, 488, 380; 361/737

(56) References Cited

U.S. PATENT DOCUMENTS

| | | | |
|---|---|---|---|
| 4,725,924 A | 2/1988 | Juan | 361/751 |
| 4,841,134 A | * 6/1989 | Hida et al. | 235/488 |
| 5,495,250 A | 2/1996 | Ghaem et al. | 342/51 |
| 5,598,032 A | * 1/1997 | Fidalgo | 235/492 |
| 5,888,624 A | 3/1999 | Haghiri et al. | 428/195 |
| 5,898,215 A | 4/1999 | Miller et al. | 257/679 |
| 5,913,110 A | 6/1999 | Herbst | 438/126 |
| 5,955,021 A | 9/1999 | Tiffany, III | 264/272.11 |
| 5,969,951 A | 10/1999 | Fischer et al. | 361/737 |
| 6,025,054 A | 2/2000 | Tiffany, III | 428/189 |
| 6,068,192 A | 5/2000 | McCabe et al. | 235/487 |
| 6,151,511 A | * 11/2000 | Cruciani | 235/486 |
| 6,161,761 A | * 12/2000 | Ghaem et al. | 235/492 |
| 6,173,898 B1 | 1/2001 | Mande | 235/488 |
| 6,223,989 B1 | * 5/2001 | Permingeat | 235/487 |

FOREIGN PATENT DOCUMENTS

| | | |
|---|---|---|
| DE | 44 03 513 | 8/1995 |
| DE | 196 01 358 | 7/1996 |
| DE | 196 32 115 | 12/1997 |
| EP | 198 376 | 10/1986 |
| EP | 615 285 | 9/1994 |
| FR | 615 285 | 1/1927 |
| FR | 2 769 440 | 4/1999 |
| JP | 02000113151 A * | 4/2000 |
| JP | 02000113155 A * | 4/2000 |
| JP | 02000155821 A * | 6/2000 |
| WO | WO 94 11846 | 5/1994 |

* cited by examiner

*Primary Examiner*—Michael G. Lee
*Assistant Examiner*—Seung H. Lee
(74) *Attorney, Agent, or Firm*—James C. Lydon

(57) ABSTRACT

The invention relates to a contactless or hybrid contact-contactless smart card, including an antenna on a support, this antenna being formed by at least one turn of electrically conductive ink which is screen printed on the support, two card bodies 24 on each side of the support, each of the card bodies consisting of at least one layer of plastic material, and a chip or module 26 connected to the antenna. The support is made of paper and features cutouts 22 in each corner at which the two card bodies are welded together, thus giving its capacity to delaminate, when the card is bent, at the location where the forces were generated, which highlights any act of deliberate damage a posteriori as the card retains the traces of the bending, and represents a countermeasure against fraud.

11 Claims, 3 Drawing Sheets

CONTACTLESS OR HYBRID CONTACT-CONTACTLESS SMART CARD DESIGNED TO LIMIT THE RISKS OF FRAUD

TECHNICAL FIELD

The present invention relates to smart cards, and more specifically a contactless or hybrid-contact contactless smart card for which the antenna is on a support made of fibrous material such as paper.

PRIOR ART

The contactless smart card is a system being used increasingly in various sectors. In the transport sector, the card has been developed as a means of payment. The same holds true for the electronic wallet. Many companies have also developed identification means for their personnel using contactless smart cards.

The exchange of information between a contactless card and the reader takes place via remote electromagnetic coupling between an antenna embedded in the contactless card and a second antenna in the reader. In order to create, store and process the information, the card is equipped with a chip or an electronic module which is connected to the antenna. The antenna and the chip are generally located on a dielectric support made of plastic material (polyvinyl chloride (PVC), polyester (PET), polycarbonate (PC) . . . ). The antenna is obtained by chemical copper or aluminum etching on the support or winding of conductive metal wire.

The card is often monobloc. The antenna support is often inserted between two layers of plastic materials (PVC, PET, PC, acrylonitrile-butadiene-styrene (ABS) . . . ) forming the upper and lower card bodies and then heat bonded by hot lamination under pressure. The chip or the module is connected to the antenna by an electrically conductive glue or equivalent which enables the ohmic contact to be established.

However, a card of this type has several major drawbacks. The most significant drawback is that the plastic heat bonding operation, implemented during the lamination process, leads to a monobloc card having mediocre mechanical properties in terms of the restitution of absorbed stresses. When excessive bending and twisting stresses are encountered, all of the stress applied is transmitted to the chip or electronic module and primarily to the bonding points which make the connections. The mechanical strength of the bonding joints is subjected to great strain which can cause the module-antenna or chip-antenna connection to break. The antenna may also be cut as a result of these mechanical stresses.

This specificity has been used by fraudulent individuals, incited to commit fraudulent acts by the availability of "smart card" technology to the general public.

Besides large-scale organized fraud which requires significant means and highly-skilled technical specialists and which consists in reproducing the behavior of a real card by using another technical component, individual fraud is the most insidious in that it involves individuals who are the customers of the card issuing organization.

One can find occasional fraud, which consists in using the card for a purpose other than the one it was designed for, or in not respecting the usage conditions prescribed by the card's issuer.

Indirect intentional fraud also exists in which a user, unfamiliar with the technique, tries to obtain a service for which a card is not programmed. This is the case of someone trying to obtain money from an automated teller machine using a transportation card, for example.

Finally, the last type of fraud is direct intentional fraud. In this case, the user is thoroughly understands how the card works and recognizes its weaknesses. It is thus relatively easy for this type of individual to destroy the card as cleanly as possible, by intense repetitive bending, when in possession of a card sold with a credit (telephone cards, mass transit cards, highway toll stations), and that this credit is exhausted or almost exhausted without it being possible to prove the intent to fraud afterwards. Then, the antenna may be cut, and the chip or module disconnected without the card being marked. Owing to its intrinsic nature, the plastic allows significant deformation without showing any visual signs.

In these three types of fraud, individuals with the intent to fraud make the card inoperative and then attempt to exchange or reimburse the card with the card issuer. The latter are thus faced with a serious problem as they want to treat their sincere customers fairly but do not want to pay the costly price of falling prey to fraud by blindly reimbursing faulty cards.

Another drawback of these cards is that they are comprised of a composite stack of glued or heat bonded plastic materials with different thermal expansion coefficients. As a result, systematic unacceptable and irreversible distortion of the cards is observed (twisting, warping), as well as a lack of mechanical resistance when subjected to standardized or equivalent tests.

Furthermore, PVC exhibits poor thermomechanical properties. During the card body lamination process, material flow is significant and the antenna's shape factor is not maintained. This leads to antenna malfunction as the electrical parameters (inductance and resistance) vary. Even more serious, it is not uncommon to experience antenna breakage in areas where strong sheer stresses are present. This is particularly the case in angles and at electrical bridging points.

The laminated ISO cards have a total thickness between 780 and 840 μm. Considering the flow of material described above, it is also very difficult to guarantee customers a narrow and controlled distribution of the cards' population.

Another major defect of these cards is that after lamination, the imprint from the copper etching is visible on the printed card bodies. Although this does not prevent the card from operating correctly, the defect is often emphasized by users who are very concerned about the aesthetic criteria.

And finally, the cost of manufacturing cards with this process is too high to enable any real increase in their usage.

SUMMARY OF THE INVENTION

The purpose of the invention is to mitigate these drawbacks by supplying a contactless or hybrid contact-contactless smart card enabling the risk of fraud to be limited by leaving a mark of any attempt to damage the card, while resisting distortion and having good mechanical resistance, thereby retaining its shape factor and enabling the integrity of the electrical parameters to be guaranteed.

The invention thus relates to a contactless or hybrid contact-contactless smart card featuring an antenna on a support, this antenna consisting of at least one turn of electrically conductive ink screen printed on the support, two card bodies on each side of the support, each card body consisting of at least one layer of plastic material, and a chip or module connected to the antenna. The support is made of paper and each corner features a cutout enabling the two card bodies to be welded together, enabling the bent card to delaminate at the location subjected to the stresses generated by the bending which will highlight any act of deliberate damage a posteriori.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE PREFERRED

Figure 1:
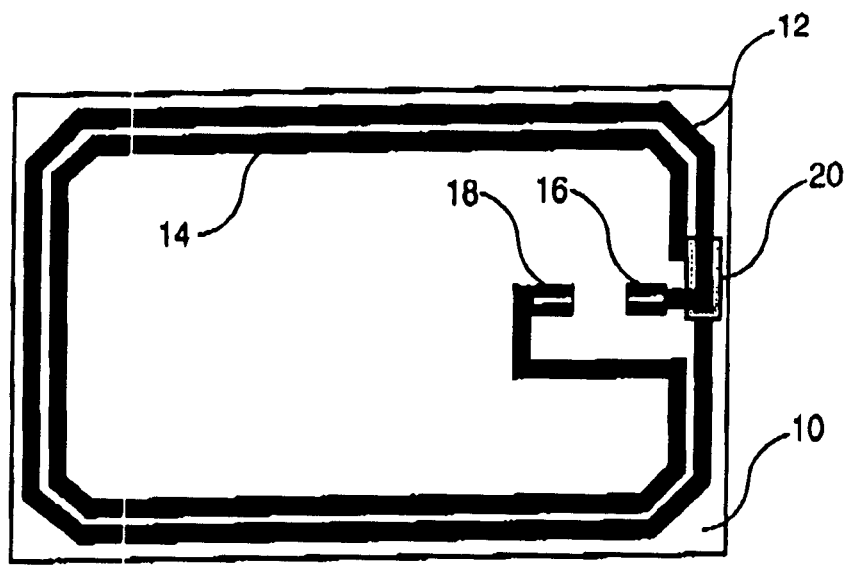
FIG. 1 represents the inverted drawing of the antenna on the paper support of a hybrid contact-contactless smart card.

In FIG. 1, the smart card according to the invention consists of a paper support 10 on which an antenna is screen printed. The antenna consists of two turns 12 and 14, screen printed with an electrically conductive polymer ink, loaded with conductive elements such as silver, copper or carbon. One end of each turn is connected to one of the antenna contacts to the module which are also screen printed, turn 12 being connected to contact 16 and turn 14 to contact 18. The turns are interconnected by an electric bridge, most commonly referred to as the "cross-over" (not shown in the figure). An insulating strip of dielectric ink 20 is screen printed between the cross-over and turn 12. The antenna drawing is reversed in relation to the normal drawing of an antenna for an ISO format smart card. This special configuration provides a hybrid contact-contactless smart card with a cavity for housing the module, milled into the card body which is opposite the side of the support bearing the screen printing, that is to say in the card body which is in contact with the side of the support not bearing the screen printing.

Figure 2:
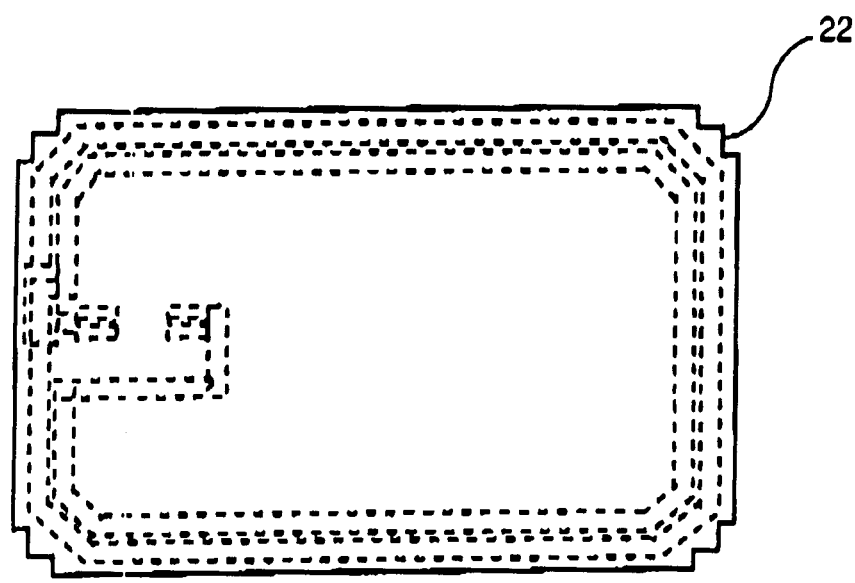
FIG. 2 represent the side of the support in contact with the card body in which the cavity is milled to accommodate a module of a hybrid-contact contactless smart card.

In this manner, when the support is reversed (contacts on the left), as shown in FIG. 2, it can be noted that the contacts of the module are in the standardized location for ISO format cards.

Figure 5:
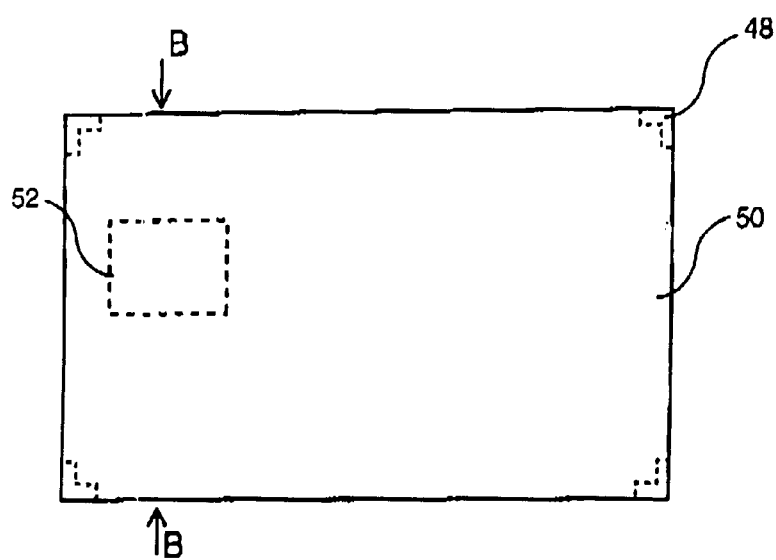
FIG. 5 represents a contactless smart card in its final configuration.
Figure 6:
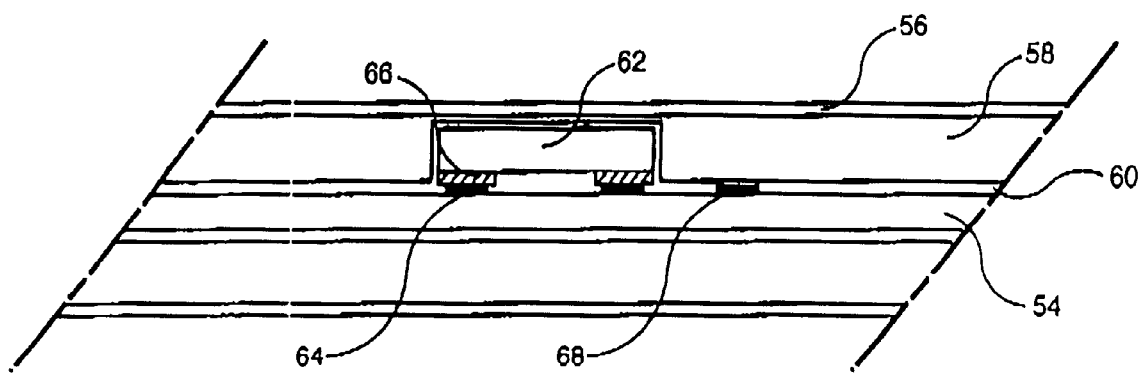
FIG. 6 represents a cross section of the smart card, represented in FIG. 5, along the axis A—A.

In the case of a purely contactless card, as represented in FIGS. 5 and 6, the drawing of the antenna is not reversed. As the chip is positioned between the antenna support and one of the card bodies, the card does not feature a milled cavity. The antenna thus does not need to be protected. The structure of such a card is thus more classic.

Figure 3:
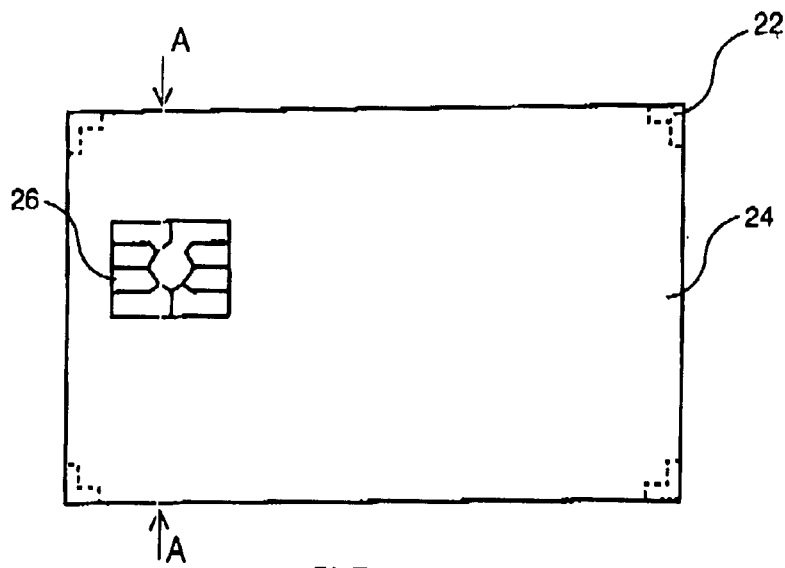
FIG. 3 represents a hybrid-contact contactless smart in its final configuration.

In FIG. 3, the hybrid contact-contactless smart card is represented in its final configuration. As shown in FIGS. 2 and 3, the support has a cutout in each corner. During the lamination process, the card bodies 24 made of plastic material are heat bonded together at the cutouts 22. As the paper pulp has low internal cohesion, the core of the paper tends to delaminate when it is subjected to shear stresses. This physical property was used to create a card with a built-in and variable stress marker. By blocking the corners by welding the two card bodies together, all of the mechanical stresses are directed inside the card at the location where the stress forces are exerted when the card is bent.

If these stresses are too strong, the paper delaminates and card opens up and splits into two parts (the part which contains the antenna connected to the module continues to function). Welding the card bodies in the corners allows the card to remain useable. In this manner, by acting on the type of paper and on its internal cohesion, we can obtain a stress marker with variable sensitivity.

The plastic material used for the card bodies is polyvinyl chloride (PVC), polyester (PET, PETG), polycarbonate (PC) or acrylonitrile-butadiene-styrene (ABS). The module 26 is installed in the cavity and connected to the antenna. A cross sectional view of the identification card along axis A—A, as shown in FIG. 4, clearly depicts its configuration.

The paper support is sandwiched between the two card bodies. Each card body consists of one sheet of plastic material. Preferably, each card body is made up of two sheets, the sheet forming the external layer and the sheet forming the internal layer. According to a special embodiment, these layers may have different stiffness. In this case, the external layer is made of rigid PVC, while the inside layer is made of soft PVC with a lower Vicat softening temperature (the temperature at which the PVC shifts from a rigid state to a rubbery state). The two layers may also be of different thickness. The external layer is thus thicker than the internal layer. The external layer has a thickness of approximately 310 microns ($\mu$m) and the internal layer has a thickness of approximately 80 $\mu$m. The preferable plastic material is PVC. The screen printed antenna is embedded in the internal layer of the card body. Owing to the low stiffness of the PVC used, it becomes fluid and traps the screen printed part in the mass of the card during the card body laminating process. In this manner, the antenna is much more resistant to mechanical stresses when using identification card.

Figure 4:
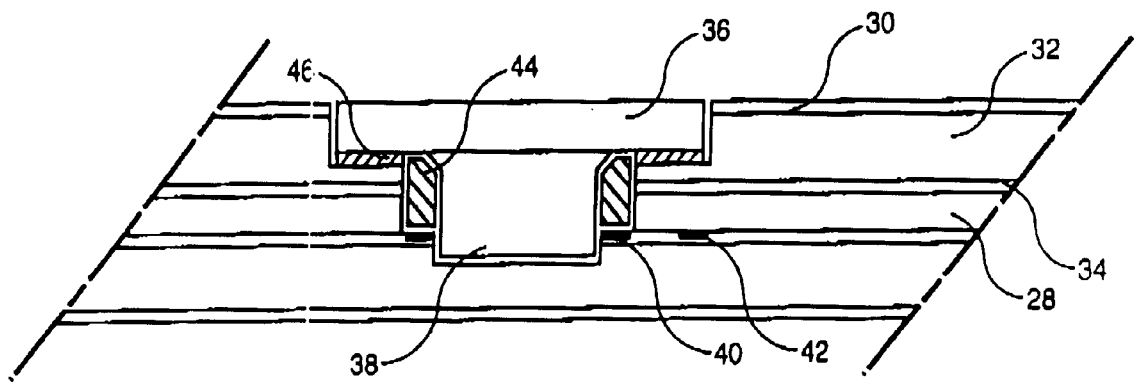
FIG. 4 represents a cross section of the smart card, represented in FIG. 3, along the axis A—A.

As shown on FIG. 4, the paper support 28 of the antenna is inserted between two card bodies comprised, according to a preferred embodiment, of three sheets. Each card body contains a cover 30 which may be a sheet of transparent PVC film or varnish layer, an external rigid PVC layer 32 and an internal soft PVC layer 34. The cover 30 is approximately 40 $\mu$m thick, the external layer approximately 275 $\mu$m thick and the internal layer approximately 40 $\mu$m thick. The thickness of these two layers may vary depending on the final flexibility of the card. The module, comprised of the double-sided circuit 36 and the chip 38 protected by an overmolding resin, is inserted in the cavity designed to this end. This cavity is obtained by milling the card body which is opposite the side of the paper support on which the antenna is printed. After the module is installed in this manner, it is connected to the antenna contacts 40. One turn 42 of the antenna, connected to one of the contacts, is trapped in the internal layer 34 of the card body made of soft PVC. The module is glued to the card. Two different adhesives are used for this purpose. The first glue is an electrically conductive adhesive 44 which enables the module to be connected to the antenna contacts. This adhesive is preferably an adhesive which contains silver. The second glue 46 is used to secure the module to the card. Cyanoacrylate glue is used. It is also possible to use a film-type "hot-melt" adhesive which is placed under the module prior to its insertion in the card.

FIG. 5 represents the contactless smart card according to the invention. The paper antenna support features cutouts 48 in the corners. This support is sandwiched between the card bodies 50. Unlike the hybrid contact-contactless card, neither of the two card bodies has a cavity. This card does not have a module, but does feature a chip 52 which is embedded in the card and thus not visible on the card's surface. A cross sectional view of this card, along axis B—B, is shown in FIG. 6.

In FIG. 6, the contactless card has the same structure as the hybrid contact-contactless card. The paper support 54 is sandwiched between two card bodies. According to a preferred embodiment, each card body is made up of three sheets. Each card body contains a cover 56 which may be a sheet of transparent PVC film or varnish layer, an external rigid PVC layer 58 and an internal soft PVC layer 60. The chip 62 is secured on the support 54 and is connected directly to the antenna contacts 64 with electrically conductive glue enabling ohmic contacts to be established. One turn 68 of the antenna, connected to one of the contacts, is trapped in the internal layer 60 of the card body made of soft PVC. The chip is thus trapped between the paper support and one of the two card bodies. The purely contactless card thus has both the same structure and properties as the hybrid contact-contactless card.

According to another special embodiment, at least one of the two card bodies consists of transparent sheets in order to render the paper support visible and particularly a graphic image printed on the support. Graphic printing techniques are well-known and perfectly controlled. The resulting quality is remarkable in terms of resolution and rendition of color compared to that obtained on a PVC type plastic support. This unique property of the paper may be used to manufacture cards on which one of the sides of the support may be dedicated to a high-quality graphic print. It thus becomes easy to put advertising, the brand name of company that distributes the card or even identification photos on the card, in the case of personal smart cards.

The smart card with a paper support according to the invention behaves differently than a monobloc PVC card. Paper is a fibrous material which absorbs part of the energy stored when the card is subjected to mechanical stresses. This cushioning effect softens the natural spring effect of the card bodies. During smart card bending and twisting tests, the energy is thus directed to the center of the paper support and not on the module or chip-antenna contacts, as on monobloc PVC cards. The module or chip connection and antenna integrity are thus preserved.

In this manner, the card according to the invention has two major qualities for the companies which use it: the preservation of the electrical components provide this card with enhanced solidity and, in case of card malfunction, the delamination property of the paper allows to make sure that the card has not been subjected to intensive folding for the purpose of frauding. When a card user intentionally or unintentionally bends the card in an excessive manner, the paper support delaminates. Unlike PVC cards, the twist or bend mark appears on the card. In the case of extreme bending or twisting, a crack appears in the card body. The card remains functional despite this twisting or bending. This situation thus discourages the individual from continuing his/her attempts to render the card inoperable for the purpose of claiming reimbursement or exchange of the card with the issuing organization, owing to the visible marks left on the card.

Furthermore, the visco-elastic properties of the polymer ink used in the screen printing process enable the turns to better resist mechanical stresses encountered during the lamination phase. Antenna breakage in areas subjected to strong sheer stresses are thus avoided.

Finally, the imprint from the screen printed turns is practically invisible on the card bodies. This parameter, which is not involved in the operation of the card, is very important for the distributors and the users who are very concerned about the aesthetic criteria.

What is claimed is:

1. A contactless or hybrid-contact contactless smart card including an antenna on a support, said antenna being comprised of at least one turn of electrically conductive ink screen printed on said support, two card bodies on each side of said support, each of said card bodies being made up of at least one layer of plastic material, and a chip or module connected to the antenna, said card being characterized in that said support is made of paper and features cutouts in each corner at which said card bodies are welded together thereby enabling said support to delaminate when bent at the location where the forces are generated by said bending, which highlights any act of deliberate damage a posteriori as the card retains the traces of the bending.

2. The smart card according to claim 1, in which said module is inserted into a cavity milled in the card body opposite the side of said support bearing the turns of the antenna.

3. The smart card according to claim 1, in which the chip is positioned between said support and one of said card bodies.

4. A smart card according to claim 1, in which each of said card bodies is comprised of at least two layers of plastic.

5. The smart card according to claim 4, in which the two sheets forming said card body layers have different stiffness and thickness.

6. The identification smart card according to claim 5, in which the sheet forming the external layer of the card bodies is made of a stiff plastic material and the sheet forming the internal layer of the card bodies is made of soft plastic having a low Vicat temperature softening temperature.

7. The identification smart card according to claim 6, in which the sheet forming the external layer is thicker than the sheet forming the internal layer.

8. The smart card according to claim 4, in which each of said card bodies further comprises a sheet of plastic material, or layer or varnish, acting as a cover.

9. A smart card according to claim 1, in which the plastic material forming the card bodies is polyvinyl chloride (PVC), polyester (PET, PETG), polycarbonate (PC) or acrylonitrile-butadiene-styrene (ABS).

10. A smart card according to claim 1, in which the ink of said screen printed turns is an electrically conductive polymer ink loaded with conductive elements.

11. A smart card according to claim 1, in which at least one of the two card bodies is made up of transparent sheets in order to have the paper support visible, and specifically a graphic image printed on said support.

* * * * *